(12) United States Patent
Vieux et al.

(10) Patent No.: US 7,402,814 B2
(45) Date of Patent: Jul. 22, 2008

(54) SOLID-STATE X-RAY DETECTOR

(75) Inventors: Gérard Vieux, Froges (FR); Didier Monin, St Etienne de Crossey (FR)

(73) Assignee: Trixell S.A.S. (FR)

( * ) Notice: Subject to any disclaimer, the term of this patent is extended or adjusted under 35 U.S.C. 154(b) by 0 days.

(21) Appl. No.: 10/492,597

(22) PCT Filed: Oct. 25, 2002

(86) PCT No.: PCT/FR02/03681

§ 371 (c)(1),
(2), (4) Date: Apr. 15, 2004

(87) PCT Pub. No.: WO03/036329

PCT Pub. Date: May 1, 2003

(65) Prior Publication Data

US 2004/0245474 A1    Dec. 9, 2004

(30) Foreign Application Priority Data

Oct. 26, 2001    (FR) .................................. 01 13899

(51) Int. Cl.
*G01T 1/20* (2006.01)
(52) U.S. Cl. ............................................. 250/370.11
(58) Field of Classification Search ............. 250/370.11
See application file for complete search history.

(56) References Cited

U.S. PATENT DOCUMENTS

| | | | | |
|---|---|---|---|---|
| 4,142,101 A | * | 2/1979 | Yin | 250/363.01 |
| 4,975,762 A | * | 12/1990 | Stradley et al. | 257/660 |
| 5,132,539 A | | 7/1992 | Kwasnick et al. | |
| 5,179,284 A | * | 1/1993 | Kingsley et al. | 250/370.11 |
| 6,042,267 A | | 3/2000 | Tachibana et al. | |
| 6,172,371 B1 | | 1/2001 | Lubowski et al. | |
| 6,272,207 B1 | * | 8/2001 | Tang | 378/149 |
| 6,448,544 B1 | * | 9/2002 | Stanton et al. | 250/208.1 |
| 6,770,885 B2 | * | 8/2004 | Eberhard et al. | 250/370.11 |
| 2004/0000644 A1 | * | 1/2004 | Homme | 250/361 R |

FOREIGN PATENT DOCUMENTS

| | | |
|---|---|---|
| EP | 0528 676 | 2/1993 |
| EP | 0529981 | 3/1993 |
| JP | 09257944 | 1/1998 |
| WO | 0151951 | 7/2001 |

* cited by examiner

*Primary Examiner*—Christine Sung
(74) *Attorney, Agent, or Firm*—Lowe Hauptman Ham & Berner, LLP

(57) ABSTRACT

The present invention relates to a solid-state X-ray detector comprising a photosensitive sensor associated with a radiation converter, known as a scintillator, transforming the X-rays into a radiation to which the sensor is sensitive, and an entry window through which the X-rays pass upstream of the scintillator. The entry window is mounted on the scintillator, without being fixed to the scintillator, and the entry window and the sensor are fixed by a water vapor-tight seal. The scintillator consists of a support, distinct from the sensor, and a scintillating substance.

The application areas of this type of detector are notably radiology (radiography, fluoroscopy and mammography), but equally, non-destructive testing.

18 Claims, 2 Drawing Sheets

SOLID-STATE X-RAY DETECTOR

FIELD OF THE INVENTION

The present invention relates to a solid-state X-ray detector comprising a photosensitive sensor associated with a radiation converter. The application areas of this type of detector are notably radiology (radiography, fluoroscopy and mammography), but equally, non-destructive testing.

BACKGROUND OF THE INVENTION

Such radiation detectors are known, for example, through French patent FR 2 605 166 in which a sensor formed from amorphous silicon photodiodes is associated with a radiation converter.

The structure and operation of such a radiation detector will be briefly recalled.

The photosensitive sensor is generally made from solid-state photosensitive elements arranged in a matrix. The photosensitive elements are made from semiconductor materials, usually from mono-crystalline silicon for sensors of the CCD or CMOS type, from poly-crystalline or amorphous silicon. A photosensitive element comprises at least one photodiode, one phototransistor or one photo-resistor. These elements are deposited onto a substrate, generally a glass plate.

These elements are not generally directly sensitive to very short wavelength radiation such as X-rays or gamma rays. This is the reason why the photosensitive sensor is associated with a radiation converter which comprises a layer of a scintillating substance. When it is excited by such radiation, this substance has the property of emitting radiation of a longer wavelength, for example visible or near-visible light, to which the sensor is sensitive. The light emitted by the radiation converter illuminates the photosensitive elements of the sensor which perform a photoelectric conversion and deliver electrical signals which are exploitable by appropriate circuits. The radiation converter will be referred to as the scintillator in the description that follows.

Certain scintillating substances of the alkaline halide or rare earth oxysulfide family are frequently employed for their good performances.

Among the alkaline halides, cesium iodide, doped with sodium or thallium according to whether an emission around 400 nanometers or around 550 nanometers, respectively, is desired, is known for its strong X-ray absorption and its excellent fluorescence efficiency. It takes the form of fine needles that are grown on a support. These needles are more or less perpendicular to this support and they partially confine the light emitted toward the sensor. Their fineness determines the resolution of the detector. Lanthanum and gadolinium oxysulfides are also widely employed for the same reasons.

However, some of these scintillating substances have the drawback of poor stability, being subject to a partial decomposition when they are exposed to water vapor, and their decomposition liberates chemical species that migrate either toward or away from the sensor. These species are very corrosive. Cesium iodide and lanthanum oxysulfide suffer notably from this drawback.

In relation to cesium iodide, its decomposition yields cesium hydroxide $Cs^+OH^-$ and free iodine $I_2$ which can then combine with iodide ions to yield the complex radical $I_3^-$.

In relation to lanthanum oxysulfide, its decomposition yields hydrogen sulfide $H_2S$ that is chemically very aggressive.

Water vapor is extremely difficult to eliminate. It is always present in ambient air as well as in the bonding compound used in the detector assembly. The presence of water vapor in the bonding compound is due either to the ambient air or as a by-product of the polymerization if the latter results from the condensation of two chemical species, which is frequently the case.

One of the important aspects during the manufacture of these detectors will be to minimize the amount of water vapor initially present inside the detector, and in contact with the scintillator, and to avoid the diffusion of this water vapor into the sensor during its operation.

Radiation detectors include an entry window through which the X-rays pass upstream of the scintillator. In addition, the scintillating substance is generally deposited onto a metallic support, the support and the scintillating substance thus forming the scintillator. Furthermore, a known solution is to use the support as an entry window.

When the scintillating substance is deposited onto the entry window to form the scintillator which is then placed on the sensor, the entry window must withstand the thermal stresses of the deposition and processing of the scintillator without being damaged and must preferentially have a thermal expansion coefficient close to that of the scintillator and to that of the sensor, or more especially to that of its substrate. The window may also be chosen to have a low modulus of elasticity, which will tend to eliminate differential stresses between on the one hand the window and the scintillator and on the other hand the window and the sensor, or more particularly the sensor substrate. Thus, the risks of the scintillator cracking or of the sensor substrate breaking are avoided.

The condition of the surface of the entry window must additionally allow the growth, especially for cesium iodide, of the finest possible needles in the most uniform manner possible. The fineness of the needles is a factor in the quality of the detector resolution.

The supports are currently made of aluminum which has an excellent transparency to the radiation to be detected and good optical properties. After a conditioning treatment of the aluminum, a satisfactory surface condition for deposition of the scintillator can be obtained. Unfortunately, its thermal expansion coefficient is very different from that of the sensor. In order to avoid significant mechanical stresses at the interface between the two elements during thermal cycling, the use of a supple leak-tight seal, capable of absorbing without damage the deformations caused by this thermal cycling, is called for. This seal is necessarily supple in order to absorb the differences in thermal expansion between the scintillator support and the sensor during thermal cycling, so as to minimize stresses and the risks of fracturing. However, supple materials are generally permeable to water vapor, which results in an insufficient protection of the scintillator against this water vapor, and hence a reduced lifetime for the detector. It is desirable for such radiation detectors to have a lifetime comparable to the cost recovery time for radiological or other equipment onto which they are mounted, which is around 10 years.

SUMMARY OF THE INVENTION

The present invention proposes a radiation detector having an improved lifetime where the roles of entry window and leak-tight seal are not both filled by the scintillator support alone, as in the case of the prior art.

For this purpose, the subject of the invention is a solid-state X-ray detector comprising a photosensitive sensor, a scintillator transforming the X-rays into a radiation to which the sensor is sensitive, and an entry window through which the X-rays pass upstream of the scintillator, characterized in that the entry window is placed on the scintillator, without being fixed to the scintillator, and that the entry window and the sensor are fixed by a water vapor-tight seal.

According to the invention, the constraints to which the scintillator support was subject are shared between the support and the new entry window proper. The scintillator support is still subject to the same constraints of reflectivity and surface condition for the scintillator deposition as in the prior art. By contrast, it is no longer subject to the constraints of being leak-tight and of supporting the seal. These constraints are now transferred to the new additional entry window.

This structure allows an entry window material to be defined that is compatible with the material that constitutes the sensor, especially in terms of the compatibility of their respective thermal expansion coefficients which should allow a seal that is harder, and therefore more impermeable to water vapor, to be used.

By separating the roles of entry window and scintillator support, there is a much wider choice of materials available for the entry window.

The invention can be implemented in two different assembly configurations of the scintillator and the sensor.

In a first, so-called separated scintillator configuration, the scintillating substance is deposited onto a support through which the radiation to be detected must pass before reaching the sensor. The whole assembly is then bonded to the sensor. In this configuration, the entry window is placed on the support without being fixed to it. This allows the entry window to keep a degree of freedom with respect to the support. The entry window can, for example, slide relative to the support in order to absorb any differential thermal expansion during changes in temperature of the detector.

In a second, so-called direct deposition configuration, the sensor serves as a support for the scintillating substance which is thus in direct and intimate contact with the sensor. The scintillating substance is then covered with a film for protection. The two configurations each have advantages and drawbacks.

The first configuration allows the scintillator and sensor to be optimized separately. The scintillator can thus undergo thermal processing, even if this is incompatible with the sensor. Cesium iodide is deposited by thermal evaporation in which it is deposited onto the support by condensation. It is then subjected to an annealing process at around 300° C. in order to achieve its optimum fluorescence efficiency. When the scintillating substance is deposited directly onto the sensor in the second, so-called direct deposition configuration, it is necessary to compromise on the annealing temperature in order to avoid damaging the sensor.

Another advantage of the first, so-called separated scintillator configuration, is that the sensor and scintillator are assembled only if their testing was successful which will improve the overall production efficiency. In the second, so-called direct deposition configuration, each time that the scintillator is defective, the sensor is discarded since an attempt to recycle it would not be worth the risk.

In the first, so-called separated scintillator configuration, the thickness of bonding compound used for assembly leads to some losses in terms of spatial resolution of the X-ray detector and in terms of the collection of light. The direct deposition of the scintillator on the sensor, on the other hand, offers the best conditions for optical coupling.

The configuration in which the scintillator is carried by the support allows the production flow to be managed more efficiently since the manufacture of the two elements, which are the scintillator with its support on the one hand and the sensor on the other, can be carried out separately.

Furthermore, the cost of the support as described in the first configuration is lower than that of the sensor which serves as a support for the scintillating substance in the second configuration. Thus, the loss faced in the case of the deposition of a deficient scintillating substance, which will mean that the scintillator and its support will have to be discarded, will be reduced.

Finally, the first configuration can be applied to photosensitive elements composed of assemblies of several butted elements such as described, for example, in the French patents published under numbers FR 2 758 654 and FR 2 758 656. The second configuration cannot be applied to such photosensitive assemblies composed of assemblies of several butted elements, owing to the poor dimensional stability of such assemblies at a temperature of 300° C. which is necessary for the implementation of the scintillating substance after deposition onto its support.

In the two configurations, the entry window must meet the following demands: it must be as transparent as possible to the radiation to be detected, it must be leak-tight to water vapor, and it must have mechanical properties compatible with the manipulations to which the detector may be subjected.

If a detector having a very good resolution is desired, it is beneficial to provide an entry window that absorbs the light emitted back by the scintillator, in other words in the opposite direction to the sensor with respect to the scintillator. However, sensitivity will be lost.

If, on the other hand, a detector with a good sensitivity is desired, then it is beneficial to provide an entry window that reflects toward the sensor the light emitted back by the scintillator. In this way, the light intensity received by the sensor, for the same quantity of radiation, is increased. This gain in sensitivity is achieved to the detriment of the resolution because, from one X-ray photon, the directly transmitted light and the reflected light could strike the sensor in different places, making the image obtained a little less sharp than in the previous case.

With the current radiological detectors, in the signal-to-noise ratio conditions of general radiography, it can be more beneficial overall to reduce the reflectivity of the entry window. Indeed, several hundred electrons are created through each X-ray photon absorbed, since the scintillator transforms one X-ray photon into a large number of photons of light. The important thing is that each X-ray photon be detected by the sensor after conversion into electrons. If the acquisition noise in the sensor is comparable to the signal resulting from the absorption of an X-ray photon, reducing the reflectivity allows the resolution to be improved without degrading the signal-to-noise ratio and the sensitivity.

BRIEF DESCRIPTION OF THE DRAWINGS

The invention will be better understood and other features and advantages will become apparent upon reading the description which follows with reference to the figures appended.

For the sake of clarity, the drawings in these figures are not to scale.

DETAILED DESCRIPTION OF THE PREFERRED EMBODIMENT

Figure 1:
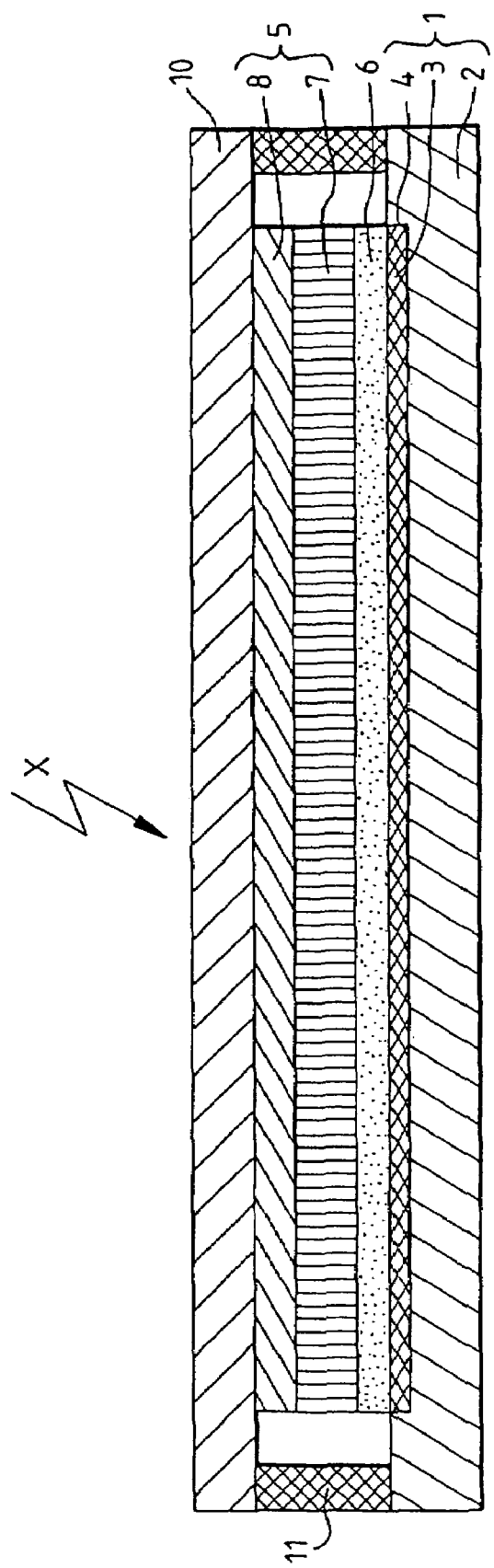
FIG. 1 shows a radiological detector according to the first configuration.

The first configuration, known as the separated scintillator configuration, is shown in FIG. 1. The radiation sensor carries the reference 1. It comprises a substrate 2, in principle a glass plate, supporting photosensitive elements 3. Each photosensitive element 3 is mounted between a row conductor and a column conductor so that it can be addressed. For simplicity, the conductors are not shown in the figure. The photosensitive elements 3 and the conductors are generally coated with a passivation layer 4 designed to protect them from water vapor.

In this configuration, the sensor 1 works together with a scintillator 5 which, in the example, is optically coupled to the sensor 1 via an optical bonding compound 6. The scintillator 5 comprises a layer of scintillating substance 7, represented with a needle-like structure, deposited onto a support 8. The support 8 thus carries the scintillating substance 7. The scintillating substance 7 belongs, for example, to the family of alkaline halides such as cesium iodide which is especially prone to oxidation in the presence of water vapor, but it could also belong to the family of rare earth oxysulfides, of which certain members such as lanthanum oxysulfide exhibit an equally poor stability.

Figure 2:
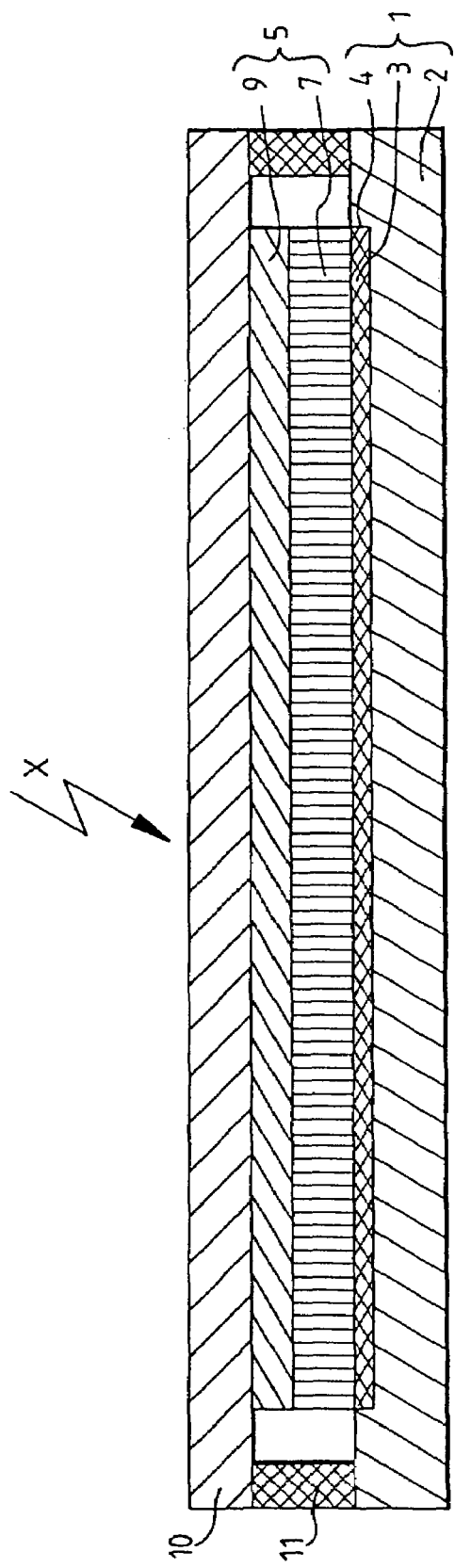
FIG. 2 shows a radiological detector according to the second configuration.

In the second configuration shown in FIG. 2, known as the direct deposition configuration, instead of depositing the scintillating substance 7 onto the support 8 and mounting this separate assembly forming the scintillator 5 on the sensor 1, as illustrated in FIG. 1, the scintillating substance 7 is deposited directly onto the sensor 1 and the scintillating substance 7 is covered with a film 9. The film 9 serves as a protection for the scintillating substance 7. For simplicity, the assembly formed by the scintillating substance 7 and the film 9, in the second configuration, is designated by the reference 5 and is denominated scintillator as in the first configuration.

In the X-ray detectors represented in FIGS. 1 and 2, an entry window 10 is placed on the scintillator 5 but is not fixed to it. A leak-tight seal 11 fixes the entry window 10 to the sensor 1 or, more precisely, to its substrate 2.

The choice of material for the leak-tight seal will depend on the entry window and sensor materials. The seal could be made from a mineral material. This type of seal exhibits very good impermeability, but it requires a high temperature of around 400° C. for its implementation.

As an alternative, the leak-tight seal could be made from an organic material. These materials are not as leak-tight as mineral materials, but on the other hand, the temperature required for their implementation is lower at around 200° C. Among organic materials, the most leak-tight is an epoxy adhesive.

As regards the entry window 10, it could be composed of any material whose thermal expansion coefficient is close to that of the material forming the sensor 1. Advantageously, the thermal expansion coefficient of the entry window is lower than that of aluminum. The similarity of the thermal expansion coefficients of the two materials to be assembled, namely that of the entry window and that of the sensor, makes the use of a hard leak-tight seal possible.

The entry window 10 can be covered with any deposition designed to improve its reflectivity or its chemical resistance to any corrosion originating, for example, from by-products of the decomposition of the scintillator in the presence of water vapor.

Several materials could be suitable for making the entry window. In general, materials containing few heavy elements are the most suitable owing to their good X-ray transparency.

The entry window could be made from glass. Glass is a single component and therefore easy to work with. Moreover, if the substrate 2 of the sensor 1 consists of a glass plate, choosing a leak-tight seal is straightforward since its compatibility with only one material, in this case glass, needs to be verified.

Carbon fiber could also be used to make the entry window. Carbon fiber has a higher transparency to X-rays than glass and is also less fragile. On the other hand, carbon fibers are often held together with epoxy resin and are more difficult to seal on account of their rough surface.

As another alternative, the entry window could be made from a ceramic material whose X-ray transparency is close to that of glass.

The entry window could also consist of an organic material such as polyester, for example. This material exhibits a higher transparency to X-rays than glass, and is also less fragile than glass. It is a homogeneous material with a smooth surface when it is produced by rolling. Nevertheless, achieving a leak-tight seal with polyester is more difficult than with glass.

The scintillator support 8, or the film 9 depending on the configuration used, could consist of any metallic material such as aluminum, titanium or other metal. It could also be composed of any ceramic or organic material such as a polyimide, for example, or else a composite material containing carbon fiber. The material chosen must be transparent to X-rays, chemically compatible with the scintillating substance, and compatible with the processes involved in the fabrication of the luminescent scintillator, such as vacuum deposition and annealing for example. Advantageously, the material chosen absorbs or reflects the light produced by the scintillator 5 but does not transmit it. In fact, the light produced by the scintillator 5 is, in general, visible or near-visible light. If the material chosen transmitted the light produced by the scintillator 5, the detector would no longer be optically shielded from the outside light, and the sensor 1 could receive light from the outside that would interfere with its operation.

The invention claimed is:

1. A solid-state X-ray detector, comprising:
   a photosensitive sensor
   a scintillator transforming X-rays into a radiation to which the sensor is sensitive, the scintillator including a support and a scintillating substance;
   the scintillating substance being deposited on a support through which the radiation to be detected must pass before reaching the sensor;
   an entry window though which the X-rays pass upstream of the scintillator, such that the support is positioned between the entry window and the scintillating substance;
   and a water vapor-tight seal attached to said photosensitive sensor and to said entry window and spaced from said scintillator, support and scintillator substance;
   wherein the entry window is adjacent to the scintillator, without being fixed to the scintillator, the entry window and the sensor being fixed by the water vapor-tight seal, the support being distinct from the sensor.

2. The X-ray detector as claimed in claim 1, wherein the thermal expansion coefficient of the entry window is lower than that of aluminum.

3. The X-ray detector as claimed in claim 2, wherein the entry window is made from glass.

4. The X-ray detector as claimed in claim 2, wherein the entry windows is made from carbon fiber.

5. The X-ray detector as claimed in claim 2, wherein the entry window is made from ceramic material.

6. The X-ray detector as claimed in claim 2, wherein the entry window is made from an organic material.

7. The X-ray detector as claimed in claim 1, wherein the water vapor-tight seal is made from an organic material.

8. The X-ray detector as claimed in claim 1, wherein the water vapor-tight seal is made from an epoxy adhesive.

9. The X-ray detector as claimed in 1, where in the scintillator comprises a material belonging to the family of alkaline halides or of rare earth oxysulfides.

10. The X-ray detector as claimed in claim 1, wherein the support is metallic.

11. The X-ray detector as claimed in claim 10, wherein the support is made from aluminum.

12. The X-ray detector as claimed in claim 10, wherein the support is made from titanium.

13. The X-ray detector as claimed in claim 1, wherein the support is organic or ceramic.

14. The X-ray detector as claimed in claim 13, wherein the support is polyimide support.

15. The X-ray detector as claimed in claim 1, wherein the scintillator comprises a material belonging to the family of cesium iodide.

16. The X-ray detector of claim 9, wherein the material is cesium iodide.

17. The X-ray detector of claim 9, wherein the material is lanthanum oxysulfide.

18. The X-ray detector as claimed in claim 1, wherein the photosensitive sensor comprises a substrate supporting photosensitive elements and wherein the substrate is a glass plate.

* * * * *